(12) United States Patent
Morozumi

(10) Patent No.: US 6,664,644 B2
(45) Date of Patent: Dec. 16, 2003

(54) SEMICONDUCTOR DEVICE AND METHOD FOR MANUFACTURING THE SAME

(75) Inventor: Yukio Morozumi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/201,722

(22) Filed: Jul. 24, 2002

(65) Prior Publication Data

US 2003/0030151 A1 Feb. 13, 2003

(30) Foreign Application Priority Data

Aug. 3, 2001 (JP) ........................................ 2001-236238

(51) Int. Cl.⁷ .......................... H01L 23/48; H01L 23/52; H01L 23/40
(52) U.S. Cl. .................... 257/777; 257/685; 257/686; 257/787
(58) Field of Search ................ 257/777, 685, 257/686, 787; 438/613

(56) References Cited

U.S. PATENT DOCUMENTS

| | | | | |
|---|---|---|---|---|
| 5,581,122 | A | * 12/1996 | Chao et al. | 257/691 |
| 5,923,090 | A | * 7/1999 | Fallon et al. | 257/777 |
| 6,157,080 | A | * 12/2000 | Tamaki et al. | 257/738 |
| 6,340,846 | B1 | * 1/2002 | LoBianco et al. | 257/783 |
| 6,388,313 | B1 | * 5/2002 | Lee et al. | 257/686 |
| 6,489,687 | B1 | * 12/2002 | Hashimoto | 257/777 |
| 2002/0089050 | A1 | * 7/2002 | Michii et al. | 257/777 |

FOREIGN PATENT DOCUMENTS

| | | |
|---|---|---|
| JP | A-2000-133712 | 5/2000 |
| JP | A 2001-244287 | 9/2001 |
| JP | A 2001-244372 | 9/2001 |

OTHER PUBLICATIONS

"Nikkei Micro Device," Feb. issue, pp. 38–67.
"Electronic Material," Sep. 1999 issue, pp. 21–85.

* cited by examiner

Primary Examiner—Jasmine Clark
(74) Attorney, Agent, or Firm—Oliff & Berridge, PLC

(57) ABSTRACT

The invention provide highly reliable semiconductor devices that realize further miniaturization and higher density. The invention also provides methods for manufacturing such semiconductor devices. A semiconductor device in accordance with the present invention includes a first semiconductor chip disposed face-down on a surface of a tape substrate, and a second semiconductor chip disposed face-up on a rear surface of the first semiconductor chip. The semiconductor device is equipped with a wiring pattern formed on a surface of the tape substrate, solder bumps formed on a rear surface of the tape substrate, solder balls of the first semiconductor chip connected to the wiring pattern, bonding pads formed on a surface of the second semiconductor chip, bonding wires that connect the bonding pads and the wiring pattern, and a resin that seals the surface of the tape substrate, the bonding wires, and the first and second semiconductor chips.

12 Claims, 4 Drawing Sheets

SEMICONDUCTOR DEVICE AND METHOD FOR MANUFACTURING THE SAME

BACKGROUND OF THE INVENTION

1. Field of Invention

The present invention relates to semiconductor devices and to methods for manufacturing semiconductor devices. More particularly, the invention relates to a semiconductor device that is reduced in size to a CSP (Chip Size Package) level, and to a method for manufacturing such a semiconductor device.

2. Description of Related Art

With further size-reduction of mobile telephones and information terminals in recent years, there are demands that smaller and lighter parts be mounted on printed circuit boards, and also semiconductor devices, such as LSIs, are required to achieve a high mounting density with a chip stacked layered structure at a CSP level. The related art, for example, Japanese laid-open patent application HEI 11-204720, discloses a stacked level CSP type semiconductor device, such as the one shown in FIG. 9, in which diced first and second semiconductor chips 51 and 52 are bonded onto a dielectric substrate 55 having mounting external terminals 53 through dielectric adhesive layers 57 and 59 with device forming surfaces thereof face-up. Electrode pads on each of the semiconductor chips are connected to wiring sections 58 on the dielectric substrate 55 using wires 54 formed of Au, Al or the like, which are then sealed by a resin 56.

Also, as disclosed in "Nikkei Micro Device," February issue, on pages 38–67, or "Electronic Material," September issue, on pages 21–85 in 1999, wafer level CSP type semiconductor devices that integrate a wafer processing process and a package assembly process are provided. They may be provided such that, by reducing the number of parts, such as interposers, and the number of processing steps, compared to conventional CSP types that are manufactured from single chips, the manufacturing cost is lowered, and the total cost of packages is lowered.

SUMMARY OF THE INVENTION

The above-described stacked level CSP type semiconductor devices that use wires also attempt to provide further miniaturization. However, because a bonding area needs to be secured for the second semiconductor chip on the surface of the first semiconductor chip, it is difficult to reduce the size in a direction parallel (lateral direction) to the chip surface.

Also, because a bonding area needs to be secured as described above, the design of a chip in an upper layer and the design of a chip in a lower layer need to be modified, for example, even when a memory capacity is desired to be simply increased.

Also, due to the capability of the wire bonding apparatus, control of wire pitches and spatial control over the wire configuration are difficult. Therefore, such semiconductor devices are not suitable for multiple-pin packages of large size LSIs.

On the other hand, the wafer level CSP type semiconductor devices have an advantage in that they can be miniaturized to a general chip size as viewed in plan. However, since it is difficult to form stacked layers, the above described related art semiconductor devices have certain limitations in achieving a higher mounting density, even though such a higher mounting density is desirable.

The present invention addresses the circumferences described above, and provides highly reliable semiconductor devices that can achieve further miniaturization and higher mounting density. The present invention also provides methods for manufacturing such semiconductor devices.

To address the problems described above, a semiconductor device in accordance with the present invention provides a first semiconductor chip disposed facedown on a surface of a tape substrate, and a second semiconductor chip disposed face-up on a rear surface of the first semiconductor chip. The semiconductor device also includes:

- a wiring pattern formed on the surface of the tape substrate;
- a mounting external terminal formed on a rear surface of the tape substrate;
- an external terminal of the first semiconductor chip connected to the wiring pattern;
- a bonding pad formed on a surface of the second semiconductor chip;
- a bonding wire that connects the bonding pad and the wiring pattern; and
- a resin that seals the surface of the tape substrate, the bonding wire, and the first and second semiconductor chips.

With the semiconductor device described above, the first semiconductor chip is connected to the wiring pattern on the tape substrate with the external terminal, and the second semiconductor chip is connected to the wiring pattern on the tape substrate with the bonding wire. In this manner, the number of chips that use bonding wires is reduced, such that the degree of freedom and flexibility in designing the second semiconductor chip are enhanced. Also, a bonding area does not need to be secured on the surface of the first semiconductor chip, the chip size in the direction parallel to the chip surface (lateral direction) can be reduced, whereby further miniaturization and greater density of semiconductor devices can be realized. Also, control of wire pitches of bonding wires and spatial control of wire configurations become easier. Lowering of the reliability that may be caused by bonding wires can be reduced or avoided, and the reliability of semiconductor devices can be enhanced.

A semiconductor device in accordance with another aspect of the present invention includes a first semiconductor chip disposed face-down on a surface of a tape substrate, a second semiconductor chip disposed face-up on a rear surface of the first semiconductor chip, and a third semiconductor chip disposed face-up on a surface of the second semiconductor chip. The semiconductor device also includes:

- a wiring pattern formed on the surface of the tape substrate;
- a mounting external terminal formed on a rear surface of the tape substrate;
- an external terminal of the first semiconductor chip connected to the wiring pattern;
- a first bonding pad formed on the surface of the second semiconductor chip;
- a second bonding pad formed on a surface of the third semiconductor chip;
- bonding wires that connect the wiring pattern to the first bonding pad and the second bonding pad, respectively; and
- a resin that seals the surface of the tape substrate, the bonding wire, and the first through third semiconductor chips.

Also, the semiconductor device in accordance with the present invention may further include a metal post formed between the external terminal and the surface of the first semiconductor chip, and a resin that seals circumferential areas of the metal post and the surface of the first semiconductor chip.

Also, in the semiconductor device in accordance with the present invention, the metal post may preferably be formed from a plated film or a metal ball.

Also, the semiconductor device in accordance with the present invention may further include a resin that seals circumferential areas of the external terminal and the surface of the first semiconductor chip. A surface of the external terminal may be exposed through the resin.

A semiconductor device in accordance with another aspect of the present invention includes a first semiconductor chip disposed face-down on a surface of a tape substrate, a second semiconductor chip disposed face-down on a rear surface of the first semiconductor chip, and a third semiconductor chip disposed face-up on a rear surface of the second semiconductor chip. The semiconductor device also includes:
- a wiring pattern formed on the surface of the tape substrate;
- a mounting external terminal formed on a rear surface of the tape substrate;
- an external terminal of the first semiconductor chip connected to the wiring pattern;
- an external terminal of the second semiconductor chip connected to the wiring pattern;
- a bonding pad formed on a surface of the third semiconductor chip;
- a bonding wire that connects the bonding pad and the wiring pattern; and
- a resin that seals the surface of the tape substrate, the bonding wire, and the first through third semiconductor chips.

A semiconductor device in accordance with another aspect of the present invention includes a first semiconductor chip disposed face-down on a surface of a tape substrate, a second semiconductor chip disposed face-down on a rear surface of the first semiconductor chip, a third semiconductor chip disposed face-up on a rear surface of the second semiconductor chip, and a fourth semiconductor chip disposed face-up on a surface of the third semiconductor chip. The semiconductor device also includes:
- a wiring pattern formed on the surface of the tape substrate;
- a mounting external terminal formed on a rear surface of the tape substrate;
- an external terminal of the first semiconductor chip connected to the wiring pattern;
- an external terminal of the second semiconductor chip connected to the wiring pattern;
- a first bonding pad formed on the surface of the third semiconductor chip;
- a second bonding pad formed on a surface of the fourth semiconductor chip;
- bonding wires that connect the wiring pattern to the first and second bonding pads, respectively; and
- a resin that seals the surface of the tape substrate, the bonding wire, and the first through fourth semiconductor chips.

Also, the semiconductor device in accordance with the present invention may further include metal posts formed between the external terminals and the surfaces of the first and second semiconductor chips, respectively, and a resin that seals circumferential areas of the metal posts and the surfaces of the first and second semiconductor chips.

Also, in the semiconductor device in accordance with the present invention, the metal posts may preferably be formed from plated films or metal balls.

Also, the semiconductor device in accordance with the present invention may further include a resin that seals circumferential areas of the external terminals and the surfaces of the first and second semiconductor chips. Surfaces of the external terminals may be exposed through the resin.

A method for manufacturing a semiconductor device in accordance with the present invention includes:
- preparing a first semiconductor chip having an external terminal on a surface thereof, and a second semiconductor chip having a bonding pad on a surface thereof, and preparing a tape substrate having a wiring pattern on a surface thereof;
- disposing the second semiconductor chip face-up on a rear surface of the first semiconductor chip;
- disposing the first semiconductor chip face-down on the surface of the tape substrate, and connecting by bonding the external terminal and the wiring pattern;
- connecting the bonding pad and the wiring pattern by a bonding wire; and
- sealing the surface of the tape substrate, the bonding wire, and the first and second semiconductor chips.

A method for manufacturing a semiconductor device in accordance with another aspect of the present invention includes:
- preparing a first semiconductor chip having an external terminal on a surface thereof, a second semiconductor chip having a first bonding pad on a surface thereof, and a third semiconductor chip having a second bonding pad on a surface thereof, and preparing a tape substrate having a wiring pattern on a surface thereof;
- disposing the second semiconductor chip face-up on a rear surface of the first semiconductor chip;
- disposing the third semiconductor chip face-up on the surface of the second semiconductor chip;
- disposing the first semiconductor chip face-down on the surface of the tape substrate, and connecting by bonding the external terminal and the wiring pattern;
- connecting the wiring pattern to the first and second bonding pads by bonding wires, respectively; and
- sealing the surface of the tape substrate, the bonding wires, and the first through third semiconductor chips.

A method for manufacturing a semiconductor device in accordance with another aspect of the present invention includes:
- preparing a semiconductor wafer having a plurality of chip regions and first metal posts to take out electrodes formed on surfaces of the chip regions;
- preparing first semiconductor chips having second metal posts to take out electrodes formed on surfaces thereof;
- disposing the first semiconductor chips face-up on the chip regions in the surface of the semiconductor wafer;
- sealing the top of the semiconductor wafer, the first metal posts, the first semiconductor chips and the second metal posts with a first resin;
- removing the first resin by a specified amount to thereby expose surfaces of the first metal posts and the second metal posts, respectively;

disposing external terminals on surfaces of the first metal posts and the second metal posts, respectively;

dividing the semiconductor wafer to form second semiconductor chips that are respectively integrated with the first semiconductor chips;

disposing a third semiconductor chip having bonding pads face-up on a rear surface of the second semiconductor chip;

preparing a tape substrate having a wiring pattern on a surface thereof;

disposing the first semiconductor chip face-down on the surface of the tape substrate, and connecting by bonding the external terminals and the wiring pattern;

connecting the bonding pads and the wiring pattern by bonding wires; and sealing the surface of the tape substrate, the bonding wires, and the first through third semiconductor chips with a second resin.

A method for manufacturing a semiconductor device in accordance with another aspect of the present invention includes:

preparing a semiconductor wafer having a plurality of chip regions and first metal posts to take out electrodes formed on surfaces of the chip regions;

preparing first semiconductor chips having second metal posts to take out electrodes formed on surfaces thereof;

disposing the first semiconductor chips face-up on the chip regions in the surface of the semiconductor wafer;

sealing the top of the semiconductor wafer, the first metal posts, the first semiconductor chips and the second metal posts with a first resin;

removing the first resin by a specified amount to thereby expose surfaces of the first metal posts and the second metal posts, respectively;

disposing external terminals on surfaces of the first metal posts and the second metal posts, respectively;

dividing the semiconductor wafer to form second semiconductor chips that are respectively integrated with the first semiconductor chips;

disposing a third semiconductor chip having first bonding pads face-up on a rear surface of the second semiconductor chip;

disposing a fourth semiconductor chip having second bonding pads face-up on a surface of the second semiconductor chip;

preparing a tape substrate having a wiring pattern on a surface thereof;

disposing the first semiconductor chip face-down on the surface of the tape substrate, and connecting by bonding the external terminals and the wiring pattern;

connecting the first and second bonding pads and the wiring pattern by bonding wires; and sealing the surface of the tape substrate, the bonding wires, and the first through fourth semiconductor chips with a second resin.

DETAILED DESCRIPTION OF PREFERRED EMBODIMENTS

Embodiments of the present invention will be described below with reference to the accompanying drawings.

Figure 1:
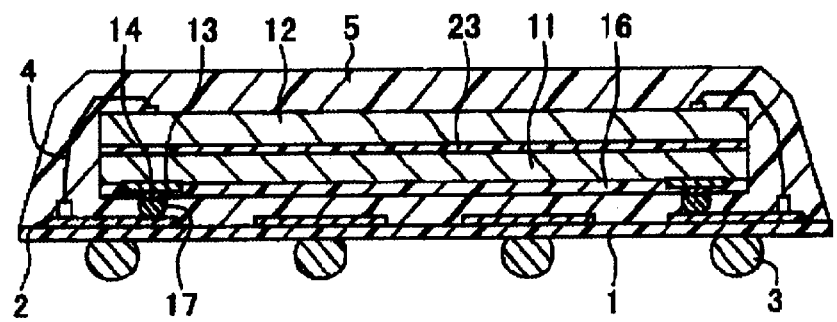
FIG. 1 is a cross-sectional view that schematically shows a cross-section of a semiconductor device in accordance with a first embodiment of the present invention.

FIG. 1 is a cross-sectional view that schematically shows a cross-section of a semiconductor device in accordance with a first embodiment of the present invention.

As shown in FIG. 1, the semiconductor device includes a tape substrate 1, such as a flexible tape, and a wiring pattern 2 is formed on an upper surface of the tape substrate 1. A plurality of solder bumps 3 that operate as mounting external terminals are formed on a lower surface of the tape substrate 1, and the solder bumps 3 are electrically connected to the wiring pattern 2.

A first semiconductor chip 11 is disposed on an upper surface of the tape substrate 1 by face-down bonding. Pads (not shown) to take out electrodes are disposed along an outer circumference of a lower active surface (lower surface) of the first semiconductor chip 11, and re-wiring layers 13 are disposed below the pads for taking out electrodes. Metal posts 14 are formed below the re-wiring layers 13. The active surface of the first semiconductor chip 11, the re-wiring layers 13 and the metal posts 14 are covered and molded with a sealing resin 16. Lower surfaces of the metal posts 14 are exposed through the sealing resin 16. Solder balls 17 that operate as external terminals are formed on the lower surfaces of the exposed metal posts 14. The solder balls 17 are connected by bonding to the wiring pattern 2 on the tape substrate 1.

A second semiconductor chip 12 is adhered to a rear surface (a surface on the opposite side of the active surface) of the first semiconductor chip 11 through a dielectric bonding layer 23. The dielectric bonding layer 23 is a layer that electrically insulates the second semiconductor chip 12 from the first semiconductor chip 11, and bonds the rear surface of the first semiconductor chip 11 and the rear surface of the second semiconductor chip. The second semiconductor chip 12 is shown to have generally the same size as that of the first semiconductor chip 11. However, the semiconductor chips are not particularly limited to such sizes.

A plurality of bonding pads (not shown) are formed along an outer circumference of an active surface (surface) of the second semiconductor chip 12. One of the ends of bonding wires 4 are connected to the respective bonding pads, and the other ends of the bonding wires 4 are connected to the wiring pattern 2 of the tape substrate 1. The upper surface of the tape substrate 1, the first and second semiconductor chips 11 and 12, and the bonding wires 4 are molded with a sealing resin 5.

Figure 2:
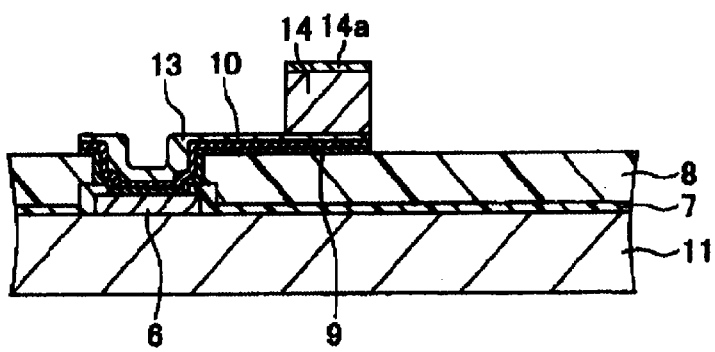
FIG. 2 is a partially enlarged cross-sectional view of a metal post region of a first semiconductor chip shown in FIG. 1.

FIG. 2 is a partially enlarged cross-sectional view of a metal post region shown in FIG. 1.

Pads 6 to take out electrodes are formed on an active surface of the first semiconductor chip 11. The pads 6 to take out electrodes are connected to various metal wirings (not shown) formed of Al, Cu or the like within the first semiconductor chip 11, and the various metal wirings are electrically connected to semiconductor elements, such as MOS transistors through interlayer dielectric films (not shown). The semiconductor elements are formed within the first semiconductor chip 11.

A final protection dielectric layer 7 formed of a silicon oxide film or a silicon nitride film is formed on the entire surface of the first semiconductor chip 11 including the pads 6 to take out electrodes. Opening sections are formed in the final protection dielectric layer 7 at locations above the pads 6 to take out electrodes. A polyimide layer 8 having a thickness of, for example, about several ten—100 $\mu$m, is formed on the final protection dielectric layer 7. The polyimide layer 8 is a layer that alleviates stresses to the semiconductor elements. Opening sections are formed in the polyimide layer 8, and these opening sections open to the opening sections in the final protection dielectric layer.

A cohesion layer 9 is formed within the opening sections and on the polyimide layer 8. The cohesion layer 9 is a layer that is formed of a high-melting point metal, such as Ti, W, TiW, Cr, Ni, TiCu, Pt or the like, or an alloy of these metals, or a nitride film of these metal. A Cu seed layer 10 is formed on the cohesion layer 9. As the Cu seed layer 46, a layer formed of Ni, Ag or Au or an alloy of these metals may be used, in addition to Cu.

A re-wiring layer 13 having a thickness of about several— several ten $\mu$m is formed on the Cu seed layer 10. The re-wiring layer 13 is formed by selectively plating Cu. A metal post 14 is formed on one end of the re-wiring layer 13. The metal post 14 is formed by selectively plating Cu or the like. A heterogeneous metal cap 14a is formed on the metal post 14 to prevent oxidation depending on the requirements. The heterogeneous metal cap 14a is formed from a material that is a type different from that of the metal post, for example, Ni, Au or Pt. The metal post 14 is electrically connected to the pad 6 to take out an electrode through the re-wiring layer 13.

Next, a method for manufacturing the semiconductor device shown in FIG. 1 will be described.

First, a first semiconductor chip 11 equipped with solder balls 17 on a surface thereof, and a second semiconductor chip 12 equipped with bonding pads, are prepared. A method for manufacturing the first semiconductor chip will be described below.

Then, a dielectric bonding layer 23 is coated on a rear surface of the first semiconductor chip 11, and then the rear surface of the second semiconductor chip 12 is placed on the rear surface of the first semiconductor chip 11 to bond the first semiconductor chip 11 and the second semiconductor chip 12 by the dielectric bonding layer 23.

Next, a tape substrate 1 is prepared. A wiring pattern 2 is formed on an upper surface of the tape substrate 1. Next, positions of the wiring pattern 2 on the tape substrate 1 and the solder balls 7 are aligned, and a semiconductor device that is formed by stacking the first semiconductor chip and the second semiconductor chip in layer into one piece is mounted on the tape substrate 1 by face-down bonding. As a result, the first semiconductor chip 11 is electrically connected to the wiring pattern 2 through the solder balls 17.

Next, the bonding pads on the second semiconductor chip 12 and the wiring pattern 2 on the tape substrate 1 are connected by bonding wires 4. As a result, the second semiconductor chip 12 is electrically connected to the wiring pattern 2 through the bonding wires 4. Then, the bonding wires 4, the top of the tape substrate 1, and the first and second semiconductor chips 11 and 12 are molded with a sealing resin 5. Next, solder bumps 3 are mounted on the lower surface of the tape substrate 1. The semiconductor device is formed in a manner described above.

A method for manufacturing the first semiconductor chip 11 is described below.

First, a semiconductor wafer is prepared. Semiconductor elements, such as MOS transistors, a variety of metal wirings electrically connected to the semiconductor elements, and interlayer dielectric layers, are formed within first semiconductor chip regions of the semiconductor wafer. Next, pads 6 to take out electrodes are formed on one of the ends of the variety of metal wirings. Next, a final protection dielectric layer 7 that is formed of a silicon oxide film or a silicon nitride film is formed on the entire surface including the pads 6 by a CVD (Chemical Vapor Deposition) method.

Then, opening sections are formed by etching in the final protection dielectric layer 7 at locations over the pads 6 to take out electrodes. Surfaces of the pads 6 are exposed through the opening sections. In this process, photosensitive polyimide may be used to directly form a pattern with opening sections, to thereby simplify the process including photoresist coating, etching and removing steps. Then, a polyimide layer 8 having a thickness of, for example, about several ten—100 $\mu$m, is coated on the final protection dielectric layer 7. Then, opening sections are formed by etching in the polyimide layer 8 at locations above the pads 6 to take out electrodes. Surfaces of the pads 6 are exposed through the opening sections.

Then, a cohesion layer 9 formed of a high-melting point metal is formed by a sputtering method inside the opening sections and on the polyimide layer 8. Next, a Cu seed layer 10 is formed on the cohesion layer 9 by a sputtering method. Next, a Cu layer having a thickness of about several— several ten $\mu$m is formed on the Cu seed layer 10 by a selective plating method. Then, the Cu seed layer 10 and the cohesion layer 9 are selectively etched using the Cu layer as a mask. As a result, a re-wiring layer 13 is formed over the polyimide layer 8 through the cohesion layer 9, and one end of the re-wiring layer 13 is electrically connected to the pad 6 to take out an electrode.

Next, a photoresist film is coated on the entire surface including the rewiring layer 13, and the photoresist film is exposed to light and developed, whereby a resist pattern having an opening section located above another end of the re-wiring layer 13 is formed on the polyimide layer 8.

Solder balls 17 are mounted on designated ones of the metal posts 14 by an automatic mounting apparatus. Next, the metal posts 14 and the solder balls 17 are subject to a beat treatment at about 170–200° C. As a result, the solder balls 17 are fused and bonded onto the metal posts 14 to thereby form mounting external terminals 17.

The solder balls 17 that become the mounting external terminals may preferably be those used for a BGA (Ball Grid Array), having a diameter of 150–300 μm, and formed from a material containing Pb/Sn by 60–70 wt %. Also, the size of each of the solder balls 17 can be appropriately selected depending on the usage. Ag/Sn containing solder, or Pb-less material containing Cu or Bi, may also be used as the solder. Also, the mounting external terminals are not limited to solder balls 17. Instead of mounting solder balls, mounting external terminals that may be formed by a printing method, a plating method or a metal jet method are also applicable.

Then, the resin 16 and the semiconductor wafer are cut by a dicing saw or a laser beam. As a result, the wafer is divided into individual chips, which become the first semiconductor chips 11 in the device configuration. In this manner, the first semiconductor chips 11 are manufactured.

In the first embodiment, the solder balls 17 are used as external terminals of the first semiconductor chip 11, the second semiconductor chip 12 is stacked in layer on the rear surface of the first semiconductor chip 11, and the second semiconductor chip 12 is connected to the wiring pattern 2 on the tape substrate 1 by the bonding wires 4, compared to the related art devices. In this manner, the number of chips that use bonding wires is reduced, such that the degree of freedom and flexibility in designing the second semiconductor chip 12 are enhanced. In other words, even when a memory capacity is desired to be simply increased, the design of a chip in an upper layer and the design of a chip in a lower layer do not need to be modified, and chip layers that can use LSIs having basically the same design are increased.

Also, in the first embodiment, only the second semiconductor chip 12 uses bonding wires. Therefore, a bonding area is not required to be secured on the surface of the first semiconductor chip 15 like the related art semiconductor devices. Accordingly, the chip size in the direction parallel to the chip surface (lateral direction) can be reduced, whereby the area of the upper surface of the package can be reduced. For this reason, articles in which the present semiconductor device is implemented can be miniaturized, can have a higher density, and can be made to be lighter, while achieving lower costs.

Also, in the present embodiment, since the number of chips that use bonding wires is reduced compared to the related art devices as described above, control of wire pitches and spatial control of wire configurations become easier. As a result, yield is enhanced, and lowering of the reliability that may be caused by bonding wires can be reduced or avoided. Also, the present embodiment can be readily applied to multiple-pin packages of large LSIs.

In the first embodiment, metal posts are formed on the first semiconductor chips 11 by plated films. However, without being limited to this embodiment, metal posts can be formed with solder balls on the first semiconductor chips. In this case also, they can be manufactured in a manner similar to the manufacturing method described above.

Figure 3:
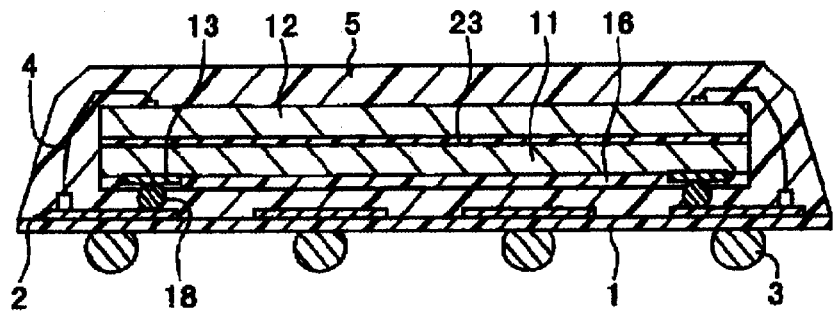
FIG. 3 is a cross-sectional view that schematically shows a cross-section of a semiconductor device in accordance with a second embodiment of the present invention.

FIG. 3 is a cross-sectional view that schematically shows a cross-section of a semiconductor device in accordance with a second embodiment of the present invention. The same portions as those shown in FIG. 1 are indicated by the same reference numbers, and only different portions will be described.

Solder balls 18 that operate as external terminals are disposed below rewiring layers 13 of a first semiconductor chip 11. Surfaces of the solder balls 18 are exposed through a sealing resin 16, and the exposed portions are connected by bonding to a wiring pattern 2 on a tape substrate 1.

When the first semiconductor chip 11 is manufactured, flux (not shown) is spin-coated or sprayed on the surface of the re-wiring layers 13, and then the solder balls 18 are mounted on designated ones of the re-wiring layers 13 by an automatic mounting apparatus. Then, the re-wiring layers 13 and the solder balls 7 are heat treated at about 170–200° C. As a result, the solder balls are fused and bonded onto the re-wiring layers 13.

Then, the active surface (surface) of the semiconductor wafer, the re-wiring layers 13, and the solder balls 18 are coated and covered with a sealing resin 16, such as epoxy resin, to a specified thickness by a molding apparatus. Then, the sealing resin 16 is etched back by a plasma apparatus, using plasma generated with an oxygen mixed gas. As a result, surfaces of the solder balls 18 are exposed through the sealing resin 16.

Next, the electrical property is examined, and parts numbers and the like are printed. Then, the resin 16 and the semiconductor wafer are cut by a dicing saw or a laser beam. As a result, the wafer is divided into individual chips, which become the first semiconductor chips 11 in the device configuration.

The second embodiment provides effects similar to those of the first embodiment.

Also, when the first semiconductor chips are manufactured, the second embodiment does not require steps to strictly control formation of metal posts or the thickness of sealing resin like the first embodiment. Accordingly, the process is simplified, the throughput can be further enhanced, and the manufacturing costs can be further reduced.

Figure 4:
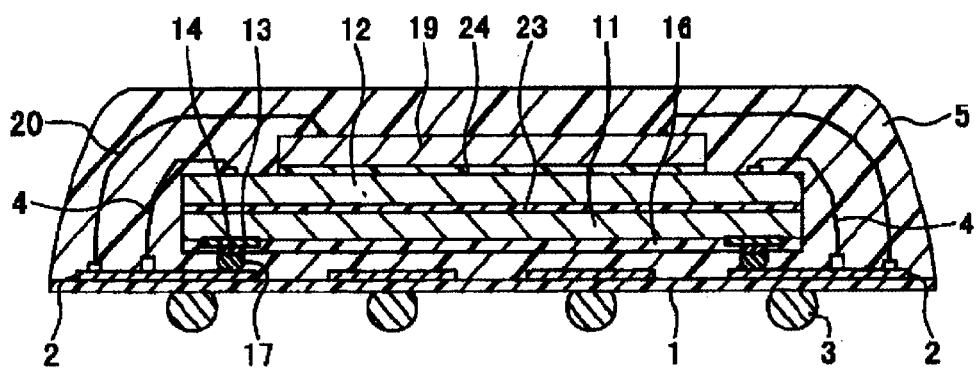
FIG. 4 is a cross-sectional view that schematically shows a cross-section of a semiconductor device in accordance with a third embodiment of the present invention.

FIG. 4 is a cross-sectional view that schematically shows a cross-section of a semiconductor device in accordance with a third embodiment of the present invention. The same portions as those shown in FIG. 1 are indicated by the same reference numbers, and only different portions will be described.

A third semiconductor chip 19 is disposed in a central area of an active surface (surface) on a second semiconductor chip 12 through a dielectric bonding layer 24. The dielectric bonding layer 24 bonds a rear surface of the third semiconductor chip 19 and the active surface of the second semiconductor chip 12, and also insulates one from the other.

A plurality of bonding pads (not shown) are formed along an outer circumference of an active surface of the third semiconductor chip 19. One of the ends of bonding wires 20 are connected to the respective bonding pads, and the other ends of the bonding wires 20 are connected to a wiring pattern 2 of a tape substrate 1. The upper surface of the tape substrate 1, the first through third semiconductor chips 11, 12 and 19, and the bonding wires 4, 20 are molded with a sealing resin 5.

Next, a method for manufacturing the semiconductor device shown in FIG. 4 will be described. However, descriptions for the same portions as those in the method for manufacturing a semiconductor device in the first embodiment will be omitted.

A second semiconductor chip 12 is disposed on a rear surface of a first semiconductor chip 11 through a dielectric bonding layer 23, and then a third semiconductor chip 19 is disposed on an active surface of the second semiconductor chip 12 through a dielectric bonding layer 24.

Then, a semiconductor device that is formed by stacking the first through third semiconductor chips 11, 12 and 19 in layers into one piece is mounted on a tape substrate 1 by face-down bonding. Then, bonding pads of the second semiconductor chip 12 and a wiring pattern 2 on the tape substrate 1 are connected by bonding wires 4, bonding pads of the third semiconductor chip 19 and the wiring pattern 2 on the tape substrate 1 are connected by bonding wires 20. As a result, the second and third semiconductor chips 12 and 19 are electrically connected to the wiring pattern 2 by the bonding wires 4 and 20, respectively. Then, the bonding wires 4 and 20, the top of the tape substrate 1, and the first through third semiconductor chips 11, 12 and 19 are molded with a sealing resin 5.

In the third embodiment, although there are two chips that use bonding wires to connect to the wiring pattern of the tape substrate, which is the same as the related art technique, the first semiconductor chip 11 is disposed in layer below the second semiconductor chip 12. As a result, LSI packages can be further miniaturized and formed with a higher density.

Figure 5:
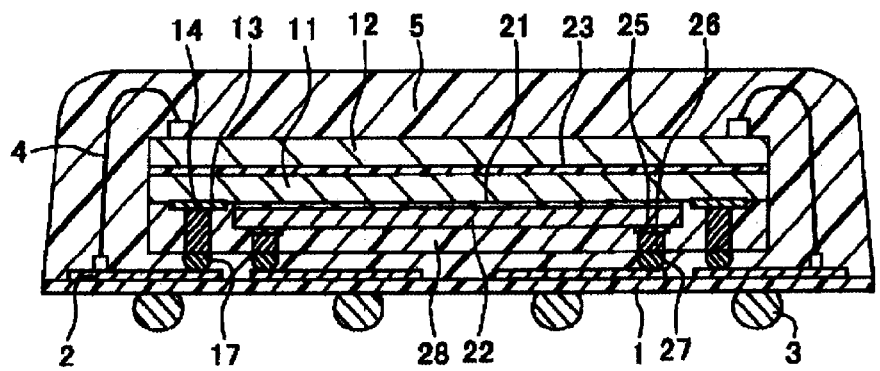
FIG. 5 is a cross-sectional view that schematically shows a cross-section of a semiconductor device in accordance with a fourth embodiment of the present invention.

FIG. 5 is a cross-sectional view that schematically shows a cross-section of a semiconductor device in accordance with a fourth embodiment of the present invention, where the same portions as those shown in FIG. 1 are indicated by the same reference numbers.

As shown in FIG. 5, a third semiconductor chip 22 is adhered to a central area of an active surface (a lower surface) of the first semiconductor chip 11 through a dielectric bonding layer 21. The dielectric bonding layer 21 is a layer that electrically insulates the third semiconductor chip 22 from the first semiconductor chip 11, and bonds the active surface of the first semiconductor chip 11 and the rear surface of the third semiconductor chip.

Pads (not shown) to take out electrodes are disposed along an outer circumference of an active surface of the first semiconductor chip 11, and re-wiring layers 13 are disposed on the pads for taking out electrodes. Metal posts 14 are formed on the rewiring layers 13. Also, pads (not shown) to take out electrodes are disposed along an outer circumference of an active surface of the third semiconductor chip 22, and re-wiring layers 25 are disposed on the pads for taking out electrodes. Metal posts 26 are formed on the rewiring layers 25. The pads and re-wiring layers are laid out in the chip in advance, such that the metal posts 14 and 26 do not interfere with one another.

The active surface of the first semiconductor chip 11, the re-wiring layers 13, the metal posts 14, the active surface of the third semiconductor chip 22, the re-wiring layers 25 and the metal posts 26 are covered and molded with a sealing resin 28. Lower surfaces of the metal posts 14 and 26 are exposed through the sealing resin 28. Solder balls 17 and 27 that operate as external terminals are formed on the lower surfaces of the exposed metal posts 14 and 26, respectively, which provides a wire-less stacked package.

A wiring pattern 2 is formed on an upper surface of a tape substrate 1. A plurality of solder bumps 3 that operate as mounting external terminals are formed on a lower surface of the tape substrate 1, and the solder bumps 3 are electrically connected to the wiring pattern 2. First and third semiconductor chips 11 and 22 are disposed on an upper surface of the tape substrate 1 by face-down bonding. The solder balls 17 and 27 are connected by bonding to the wiring pattern 2 on the tape substrate 1.

A second semiconductor chip 12 is adhered to a rear surface (a surface on the opposite side of the active surface) of the first semiconductor chip 11 through a dielectric bonding layer 23. The dielectric bonding layer 23 is a layer that electrically insulates the second semiconductor chip 12 from the first semiconductor chip 11, and bonds the rear surface of the first semiconductor chip 11 and the rear surface of the second semiconductor chip. The second semiconductor chip 12 is shown to have generally the same size as that of the first semiconductor chip 11, but the semiconductor chips are not particularly limited to such sizes.

A plurality of bonding pads (not shown) are formed along an outer circumference of an active surface (surface) of the second semiconductor chip 12. One of the ends of bonding wires 4 are connected to the respective bonding pads, and the other ends of the bonding wires 4 are connected to the wiring pattern 2 of the tape substrate 1. The upper surface of the tape substrate 1, the first through third semiconductor chips 11, 12 and 22, and the bonding wires 4 are molded with a sealing resin 5.

Next, a method for manufacturing the semiconductor device shown in FIG. 5 will be described with reference to FIGS. 6(A)–6(D). FIGS. 6(A)–6(D) are cross-sectional views that show in cross-section a method for manufacturing a device that integrates the first and third semiconductor chips shown in FIG. 5.

Figure 6:
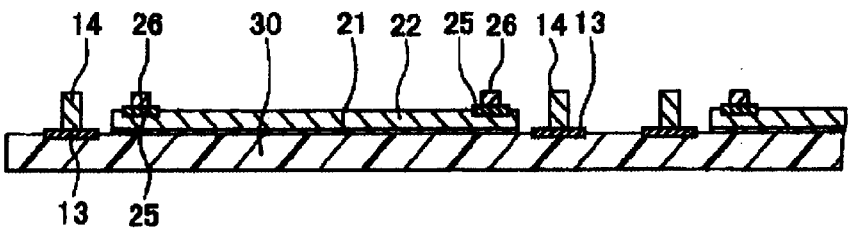
FIGS. 6(A)–(D) are cross-sectional views that show in cross-section a method for manufacturing a device that integrates the first and third semiconductor chips shown in FIG. 5.
Figure 6:
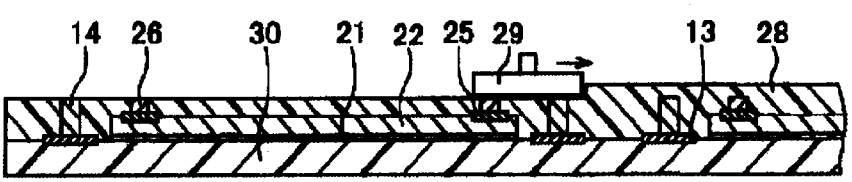
Figure 6:
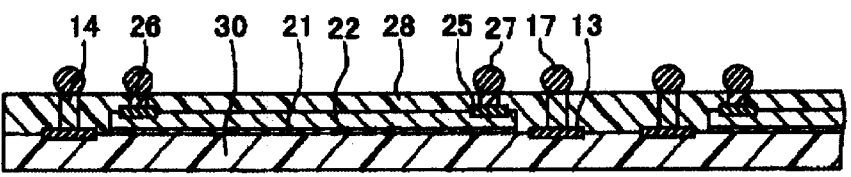
Figure 6:
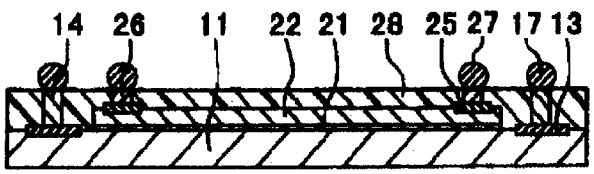

A semiconductor wafer 30, as shown in FIG. 6(A), which has been processed to a state where re-wiring layers 13 and metal posts 14 are formed by a wafer process, is prepared, and third semiconductor chips 22 are prepared. Here, the third semiconductor chips 22 are individual chips obtained by dicing and dividing a semiconductor wafer that has been processed to a state where metal posts are formed.

Then, a plurality of the third semiconductor chips 22 are disposed on the semiconductor wafer 30 through dielectric bonding layers 21, such as thermocompression sheets. In other words, rear surfaces of the third semiconductor chips 22 are bonded to central areas in respective chip regions of the wafer 30 by the dielectric bonding layers 21. In this instance, the semiconductor wafer 30 and the third semiconductor chips 22 are aligned with one another, using mounting identification marks formed on the wafer 30 as references. These mounting identification marks are patterned in scribe regions or the like simultaneously in a photo-etching process in the wafer process. The third semiconductor chips 22 that are used have been ground to have a thickness (a thickness of the chip including the metal posts 26) that is thinner than the height of the metal posts 14 of the semiconductor wafer 30.

Then, as shown in FIG. 6(B), the active surface (surface) of the semiconductor wafer 30, the re-wiring layers 13, the metal posts 14, the third semiconductor chips 22, the re-wiring layers 25, and the metal posts 26 are covered with a sealing resin 28, such as an epoxy resin, and molded by a molding apparatus. Then, the sealing resin 28 is ground by a grinder 29 by a required amount. The required amount is an amount to be ground to the extent that head sections (upper sections) of the metal posts 14 and 26 are exposed.

Here, the grinder 29 is used to grind the sealing resin 28, but can be ground by another method without being limited to this method. For example, the entire upper surface of the wafer may be ground together by a mechanical polishing method, or etched back by a dry etcher using oxygen, $CF_4$ or $NF_3$, or a mixture of these gases.

Next, as shown in FIG. 6(C), the exposed portions of the metal posts 14 and 26 are coated with flux (not shown), and then solder balls 17 and 27 are mounted on designated ones of the metal posts 14 and 26 by an automatic mounting apparatus. Next, the metal posts 14 and 26 and the solder balls 17 and 27 are heat treated at about 170–200° C. As a result, the solder balls 17 and 27 are fused and bonded onto the metal posts 14 and 26.

The solder balls 17 and 27 that become the external terminals may preferably be those for a BGA, like the first embodiment. The size of each of the solder balls 17 and 27 can be appropriately selected depending on the usage. Ag/Sn containing solder, or Pb-less material containing Cu or Bi may also be used as the solder. Also, the external terminals are not limited to solder balls. Instead of mounting solder balls, mounting external terminals that may be formed by a printing method, a plating method or a metal jet method are also applicable.

Then, as shown in FIG. 6(D), the resin 28 and the semiconductor wafer 30 are cut by a dicing saw or a laser beam to provide structures, each having the third semiconductor chip stacked in layer on the first semiconductor chip. As a result, the wafer is divided into individual chips.

Then, a dielectric bonding layer 23 is coated on a rear surface of the first semiconductor chip 11, and then the rear surface of the second semiconductor chip 12 is placed on the rear surface of the first semiconductor chip 11 to bond the first semiconductor chip 11 and the second semiconductor chip 12 by the dielectric bonding layer 23.

Next, a tape substrate 1 is prepared. A wiring pattern 2 is formed on an upper surface of the tape substrate 1. Next, positions of the wiring pattern 2 on the tape substrate 1 and the solder balls 7 and 27 are aligned, and a semiconductor device that is formed by stacking the first through third semiconductor chips in layers into one piece is mounted on the tape substrate 1 by face-down bonding. As a result, the first semiconductor chip 11 is electrically connected to the wiring pattern 2 through the solder balls 17 and 27.

Next, the bonding pads on the second semiconductor chip 12 and the wiring pattern 2 on the tape substrate 1 are connected by bonding wires 4. As a result, the second semiconductor chip 12 are electrically connected to the wiring pattern 2 through the bonding wires 4. Then, the bonding wires 4, the top of the tape substrate 1, and the first through third semiconductor chips 11, 12 and 22 are molded with a sealing resin 5. Next, solder bumps 3 are mounted on the lower surface of the tape substrate 1. The semiconductor device is formed in a manner described above.

The fourth embodiment provides effects similar to those of the first embodiment. Moreover, since the third semiconductor chip 22 is disposed on the lower surface of the first semiconductor chip 11, a higher density can be realized.

Figure 7:
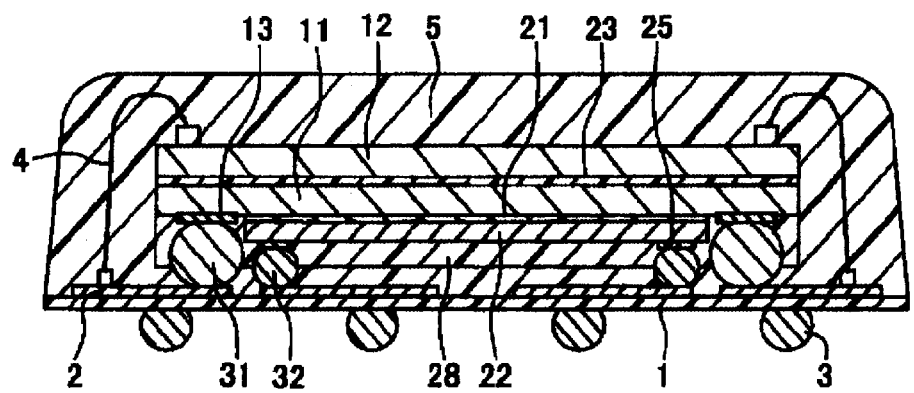
FIG. 7 is a cross-sectional view that schematically shows a cross-section of a semiconductor device in accordance with a fifth embodiment of the present invention.

FIG. 7 is a cross-sectional view that schematically shows a cross-section of a semiconductor device in accordance with a fifth embodiment of the present invention. The same portions as those shown in FIG. 5 are indicated by the same reference numbers, and only different portions will be described.

Solder balls 31 that operate as external terminals are disposed below rewiring layers 13 of a first semiconductor chip 11. Solder balls 32 that operate as external terminals are disposed below re-wiring layers 25 of a third semiconductor chip 22. Surfaces of the solder balls 31 and 32 are exposed through a sealing resin 28, and the exposed portions are connected by bonding to a wiring pattern 2 of a tape substrate 1.

Next, a method for manufacturing the semiconductor device shown in FIG. 7 will be described.

First, a semiconductor wafer, which has been processed to a state where rewiring layers 13 are formed by a wafer process, is prepared, and third semiconductor chips 22 are prepared. Here, the third semiconductor chips 22 are individual chips obtained by dicing and dividing a semiconductor wafer that has been processed to a state where re-wiring layers 25 are formed.

Then, a plurality of the third semiconductor chips 22 are disposed on the semiconductor wafer 30 through dielectric bonding layers 21, such as thermocompression sheets. In other words, rear surfaces of the third semiconductor chips 22 are bonded to central areas in respective chip regions on the semiconductor wafer by the dielectric bonding layers 21. In this instance, the semiconductor wafer and the third semiconductor chips 22 are aligned with one another, using mounting identification marks formed on the wafer as references. These mounting identification marks are patterned in scribe regions or the like simultaneously in a photo-etching process in the wafer process.

Then, flux (not shown) is spin-coated or sprayed on the surface of the rewiring layers 13 and 25, and then solder balls 31 and 32 are mounted on designated ones of the re-wiring layers 13 and 25 by an automatic mounting apparatus. Then, the re-wiring layers 13 and 25 and the solder balls 31 and 32 are heat treated at about 170–200° C. As a result, the solder balls 31 and 32 are fused and bonded onto the re-wiring layers 13 and 25.

Then, the active surface (surface) of the semiconductor wafer, the re-wiring layers 13, the solder balls 31, the third semiconductor chip 22, the re-wiring layer 25 and the solder balls 32 are coated and covered with a sealing resin 28, such as epoxy resin to a specified thickness by a molding apparatus. Then, the sealing resin 28 is etched back by a plasma apparatus, using plasma generated with an oxygen mixed gas. As a result, surfaces of the solder balls 31 and 32 are exposed through the sealing resin 28.

Next, the resin 28 and the semiconductor wafer are cut by a dicing saw or a laser beam to provide individual semiconductor device articles, each having a structure in which the third semiconductor chip is stacked in layers on the first semiconductor chip. As a result, the wafer is divided into individual chips. Succeeding manufacturing steps are similar to those of the fourth embodiment, and therefore their description is omitted.

The fifth embodiment provides effects similar to those of the fourth embodiment.

Also, when the first and third semiconductor chips are manufactured, the fifth embodiment does not require steps to strictly control formation of metal posts or the thickness of sealing resin like the fourth embodiment. Accordingly, the process is simplified, the throughput can be further enhanced, and the manufacturing costs can be further reduced.

Figure 8:
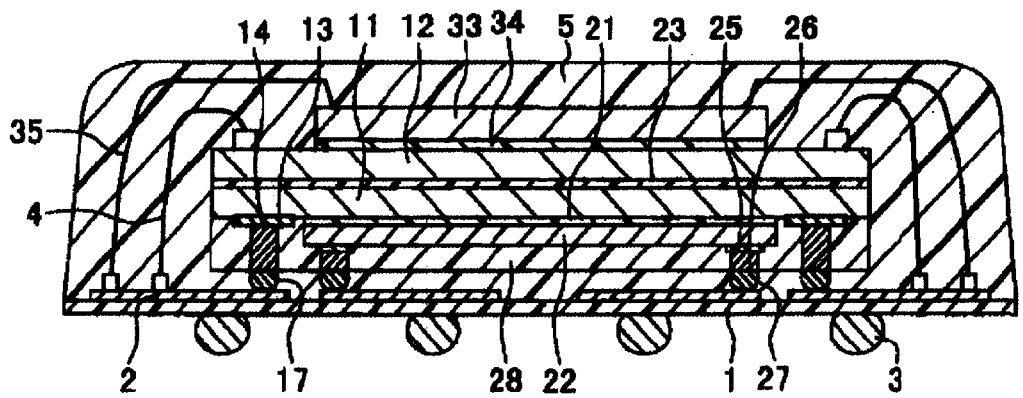
FIG. 8 is a cross-sectional view that schematically shows a cross-section of a semiconductor device in accordance with a sixth embodiment of the present invention.
Figure 9:
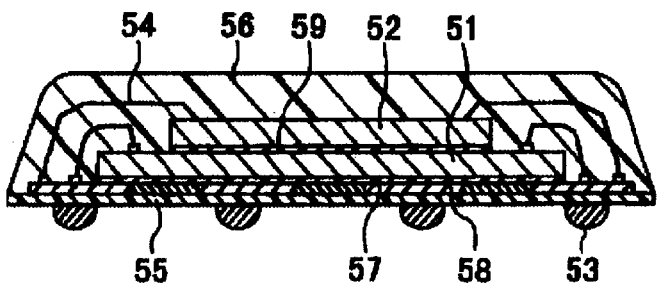
FIG. 9 is a cross-sectional view that schematically shows a cross-section of an example of a conventional semiconductor device.

FIG. 8 is a cross-sectional view that schematically shows a cross-section of a semiconductor device in accordance with a sixth embodiment of the present invention. The same portions as those shown in FIG. 5 are indicated by the same reference numbers, and only different portions will be described.

A fourth semiconductor chip 33 is disposed in a central area of an active surface (surface) on a second semiconductor chip 12 through a dielectric bonding layer 34. The dielectric bonding layer 34 bonds a rear surface of the fourth semiconductor chip 33 and the active surface of the second semiconductor chip 12, and also insulates one from the other.

A plurality of bonding pads (not shown) are formed along an outer circumference of an active surface of the fourth semiconductor chip 33. One of the ends of bonding wires 35 are connected to the respective bonding pads, and the other ends of the bonding wires 35 are connected to a wiring pattern 2 of a tape substrate 1. The upper surface of the tape substrate 1, the first through fourth semiconductor chips 11, 12, 22 and 33, and the bonding wires 4, 35 are molded with a sealing resin 5.

Next, a method for manufacturing the semiconductor device shown in FIG. 8 will be described. However, descriptions for the same portions as those in the method for manufacturing a semiconductor device in the fourth embodiment will be omitted.

A second semiconductor chip 12 is disposed on a rear surface of a first semiconductor chip 11 through a dielectric bonding layer 23, and then a fourth semiconductor chip 33 is disposed on an active surface of the second semiconductor chip 12 through a dielectric bonding layer 34.

Then, a semiconductor device, which is formed by stacking the first through fourth semiconductor chips 11, 12, 22 and 33 in layers into one piece, is mounted on a tape substrate 1 by face-down bonding. Then, bonding pads of the second semiconductor chip 12 and a wiring pattern 2 on the tape substrate 1 are connected by bonding wires 4, bonding pads of the fourth semiconductor chip 33 and the wiring pattern 2 on the tape substrate 1 are connected by bonding wires 35. As a result, the second and fourth semiconductor chips 12 and 33 are electrically connected to the wiring pattern 2 by the bonding wires 4 and 35, respectively. Then, the bonding wires 4 and 35, the top of the tape substrate 1, and the first through fourth semiconductor chips 11, 12, 22 and 33 are molded with a sealing resin 5.

In the sixth embodiment, although there are two chips that use bonding wires to connect to the wiring pattern of the tape substrate, which is the same as the related art technique, the first and third semiconductor chips 11 and 22 are disposed in layer below the second semiconductor chip 12. As a result, LSI packages can be further miniaturized and formed with a higher density.

Also, the present invention is not limited to the first through sixth embodiments, and can be modified and implemented in many different ways. For example, the semiconductor devices described above are applicable to a variety of LSIs, such as memories and logics. Also, the sealing resins 16 and 28 used for the semiconductor chips that are mounted face-down are rather provided to prevent dislocations of the metal posts with respect to the solder balls, to prevent falls, and to reinforce metal posts, and therefore may not be necessary in terms of surface protection because the resin 5 is finally applied to provide re-sealing.

As described above, in accordance with the present invention, a first semiconductor chip is disposed face-down on a surface of a tape substrate, a second semiconductor chip is disposed face-up on a rear surface of the first semiconductor chip, the first semiconductor chip is connected to a wiring pattern on the tape substrate through external terminals, and the second semiconductor chip is connected to the wiring pattern on the tape substrate through bonding wires. Accordingly, the present invention can provide highly reliable semiconductor devices that realize further miniaturization and higher density. The present invention can also provide methods for manufacturing such semiconductor devices.

What is claimed is:

1. A semiconductor device, comprising:
   a tape substrate defining a surface and a rear surface;
   a first semiconductor chip defining a rear surface and disposed face-down on the surface of the tape substrate;
   a second semiconductor chip defining a surface and disposed face-up on the rear surface of the first semiconductor chip;
   a wiring pattern formed on the surface of the tape substrate;
   a mounting external terminal formed on the rear surface of the tape substrate;
   an external terminal of the first semiconductor chip connected to the wiring pattern;
   a bonding pad formed on the surface of the second semiconductor chip;
   a bonding wire that connects the bonding pad and the wiring pattern; and
   a first resin that seals circumferential areas of the external terminal and the surface of the first semiconductor chip, a surface of the external terminal being exposed through the first resin; and
   a second resin that seals the surface of the tape substrate, the bonding wire, the first semiconductor chip, and the second semiconductor chip.

2. The semiconductor device according to claim 1, further comprising a metal post formed between the external terminal and the surface of the first semiconductor chip, and a third resin that seals circumferential areas of the metal post and the surface of the first semiconductor chip.

3. The semiconductor device according to claim 2, the metal post being formed from at least one of a plated film and a metal ball.

4. A semiconductor device, comprising:
   a tape substrate defining a surface and a rear surface;
   a first semiconductor chip defining a rear surface and disposed face-down on the surface of the tape substrate;
   a second semiconductor chip defining a surface and disposed face-up on the rear surface of the first semiconductor chip;
   a third semiconductor chip defining a surface and disposed face-up on the surface of the second semiconductor chip;
   a wiring pattern formed on the surface of the tape substrate;
   a mounting external terminal formed on the rear surface of the tape substrate;
   an external terminal of the first semiconductor chip connected to the wiring pattern;
   a first bonding pad formed on the surface of the second semiconductor chip;
   second bonding pad formed on the surface of the third semiconductor chip;
   bonding wires that connect the wiring pattern to the first bonding pad and the second bonding pad, respectively;
   a first resin that seals circumferential areas of the external terminal and the surface of the first semiconductor chip, a surface of the external terminal being exposed through the first resin; and
   a second resin that seals the surface of the tape substrate, the bonding wire, the first semiconductor chip, the second semiconductor chip, and the third semiconductor chip.

5. A semiconductor device, comprising:
   a tape substrate defining a surface and a rear surface;
   a first semiconductor chip defining a rear surface and disposed face-down on the surface of a tape substrate;
   a second semiconductor chip defining a rear surface and disposed face-down on the rear surface of the first semiconductor chip;
   a third semiconductor chip defining a surface and disposed face-up on the rear surface of the second semiconductor chip;
   a wiring pattern formed on the surface of the tape substrate;

a mounting external terminal formed on the rear surface of the tape substrate;

an external terminal of the first semiconductor chip connected to the wiring pattern;

an external terminal of the second semiconductor chip connected to the wiring pattern;

a bonding pad formed on the surface of the third semiconductor chip;

a bonding wire that connects the bonding pad and the wiring pattern;

a first resin that seals circumferential areas of the external terminals and the surface of the first semiconductor chip and the second semiconductor chip, surface of the external terminals being exposed through the first resin; and a second resin that seals the surface of the tape substrate, the bonding wire, the first semiconductor chip, the second semiconductor chip, and the third semiconductor chip.

6. The semiconductor device according to claim 5, further comprising metal posts formed between the external terminals and the surface of the first semiconductor chip and the second semiconductor chip, respectively, and a third resin that seals circumferential areas of the metal posts and the surface of the first semiconductor chip and the second semiconductor chip.

7. The semiconductor device according to claim 6, the metal posts being formed from plated films or metal balls.

8. A semiconductor device, comprising:

a tape substrate defining a surface and a rear surface;

a first semiconductor chip defining a rear surface and disposed face-down on the surface of the tape substrate;

a second semiconductor chip defining a rear surface and disposed face-down on the rear surface of the first semiconductor chip;

a third semiconductor chip defining a surface and disposed face-up on the rear surface of the second semiconductor chip;

a fourth semiconductor chip defining a surface and disposed face-up on the surface of the third semiconductor chip;

a wiring pattern formed on the surface of the tape substrate;

a mounting external terminal formed on the rear surface of the tape substrate;

an external terminal of the first semiconductor chip connected to the wiring pattern;

an external terminal of the second semiconductor chip connected to the wiring pattern;

a first bonding pad formed on the surface of the third semiconductor chip;

a second bonding pad formed on the surface of the fourth semiconductor chip;

bonding wires that connect the wiring pattern to the first bonding pad and the second bonding pad, respectively;

a first resin that seals circumferential areas of the external terminal and the surface of the first semiconductor chip and the second semiconductor chip, a surfaces of the external terminal being exposed through the first resin; and a second resin that seals the surface of the tape substrate, the bonding wire, the first semiconductor chip, the second semiconductor chip, the third semiconductor chip, and the fourth semiconductor chip.

9. A method for manufacturing a semiconductor device, comprising:

preparing a first semiconductor chip having an external terminal on a surface thereof, and a second semiconductor chip having a bonding pad on a surface thereof;

preparing a tape substrate having a wiring pattern on a surface thereof;

disposing the second semiconductor chip face-up on a rear surface of the first semiconductor chip;

disposing the first semiconductor chip face-down on the surface of the tape substrate;

connecting, by bonding, the external terminal and the wiring pattern;

connecting the bonding pad and the wiring pattern by a bonding wire;

a first resin that seals circumferential areas of the external terminal and the surface of the first semiconductor chip, a surface of the external terminal being exposed through the first resin; and sealing the surface of the tape substrate, the bonding wire, the first semiconductor chip, and the second semiconductor chip.

10. A method for manufacturing a semiconductor device, comprising:

preparing a first semiconductor chip having an external terminal on a surface thereof, a second semiconductor chip having a first bonding pad on a surface thereof, and a third semiconductor chip having a second bonding pad on a surface thereof;

preparing a tape substrate having a wiring pattern on a surface thereof;

disposing the second semiconductor chip face-up on a rear surface of the first semiconductor chip;

disposing the third semiconductor chip face-up on the surface of the second semiconductor chip;

disposing the first semiconductor chip face-down on the surface of the tape substrate;

connecting by bonding the external terminal and the wiring pattern;

connecting the wiring pattern to the first bonding pad and the second bonding pad by bonding wires, respectively;

a first resin that seals circumferential areas of the external terminal and the surface of the first semiconductor chip, a surface of the external terminal being exposed through the first resin; and sealing the surface of the tape substrate, the bonding wires, the first semiconductor chip, the second semiconductor chip, and the third semiconductor chip.

11. A method for manufacturing a semiconductor device, comprising:

preparing a semiconductor wafer having a plurality of chip regions and first metal posts to take out electrodes formed on surfaces of the chip regions;

preparing first semiconductor chips having second metal posts to take out electrodes formed on surfaces thereof;

disposing the first semiconductor chips face-up on the chip regions in the surface of the semiconductor wafer;

sealing a top of the semiconductor wafer, the first metal posts, the first semiconductor chips and the second metal posts with a first resin;

removing the first resin by a specified amount to thereby expose surfaces of the first metal posts and the second metal posts, respectively;

disposing external terminals on surfaces of the first metal posts and the second metal posts, respectively;

dividing the semiconductor wafer to form second semiconductor chips that are respectively integrated with the first semiconductor chips;

disposing a third semiconductor chip having bonding pads face-up on a rear surface of the second semiconductor chip;

preparing a tape substrate having a wiring pattern on a surface thereof;

disposing the first semiconductor chip face-down on the surface of the tape substrate;

connecting, by bonding, the external terminals and the wiring pattern;

connecting the bonding pads and the wiring pattern by bonding wires; and sealing the surface of the tape substrate, the bonding wires, the first semiconductor chips, the second semiconductor chips, and the third semiconductor chip with a second resin.

12. A method for manufacturing a semiconductor device, comprising:

preparing a semiconductor wafer having a plurality of chip regions and first metal posts to take out electrodes formed on surfaces of the chip regions;

preparing first semiconductor chips having second metal posts to take out electrodes formed on surfaces thereof;

disposing the first semiconductor chips face-up on the chip regions in the surface of the semiconductor wafer;

sealing a top of the semiconductor wafer, the first metal posts, the first semiconductor chips and the second metal posts with a first resin;

removing the first resin by a specified amount to thereby expose surfaces of the first metal posts and the second metal posts, respectively;

disposing external terminals on surfaces of the first metal posts and the second metal posts, respectively;

dividing the semiconductor wafer to form second semiconductor chips that are respectively integrated with the first semiconductor chips;

disposing a third semiconductor chip having first bonding pads face-up on a rear surface of the second semiconductor chip;

disposing a fourth semiconductor chip having second bonding pads face-up on a surface of the second semiconductor chip;

preparing a tape substrate having a wiring pattern on a surface thereof;

disposing the first semiconductor chip face-down on the surface of the tape substrate;

connecting, by bonding, the external terminals and the wiring pattern;

connecting the first bonding pads, the second bonding pads and the wiring pattern by bonding wires; and sealing the surface of the tape substrate, the bonding wires, the first semiconductor chips, the second semiconductor chips, the third semiconductor chip, and the fourth semiconductor chip with a second resin.

* * * * *